(12) United States Patent  
Lee

(10) Patent No.: US 7,633,323 B2  
(45) Date of Patent: Dec. 15, 2009

(54) DELAYED LOCKED LOOP

(75) Inventor: Hye Young Lee, Cheongiu-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 194 days.

(21) Appl. No.: 11/824,842

(22) Filed: Jun. 29, 2007

(65) Prior Publication Data

US 2008/0157838 A1 Jul. 3, 2008

(30) Foreign Application Priority Data

Dec. 29, 2006 (KR) ...................... 10-2006-0138772

(51) Int. Cl.
*H03L 7/06* (2006.01)
(52) U.S. Cl. ...................... 327/158; 327/149
(58) Field of Classification Search .................. 327/158
See application file for complete search history.

(56) References Cited

U.S. PATENT DOCUMENTS

| | | | |
|---|---|---|---|
| 6,518,807 B1 * | 2/2003 | Cho ........................... | 327/158 |
| 6,677,792 B2 | 1/2004 | Kwak | |
| 6,917,229 B2 * | 7/2005 | Cho ........................... | 327/158 |
| 7,161,397 B2 * | 1/2007 | Lee et al. .................... | 327/149 |
| 7,282,974 B2 * | 10/2007 | Lee ............................. | 327/158 |
| 2006/0001463 A1 * | 1/2006 | Lee et al. .................... | 327/147 |
| 2007/0046347 A1 * | 3/2007 | Lee ............................. | 327/158 |

FOREIGN PATENT DOCUMENTS

| KR | 1020040095981 A | 11/2004 |
|---|---|---|
| KR | KO-10-2006-0000866 | 1/2006 |

* cited by examiner

*Primary Examiner*—Lincoln Donovan  
*Assistant Examiner*—Ryan C Jager  
(74) *Attorney, Agent, or Firm*—John P. White; Cooper & Dunham LLP

(57) ABSTRACT

A delay locked loop is disclosed which includes a clock selector for selecting and outputting any one of normal-phase and reverse-phase external clocks in response to a clock selection information signal, a first delay line for delaying an output signal from the clock selector by a predetermined amount of time, a second delay line for delaying an inverted version of an output signal from the first delay line by a predetermined amount of time, and a phase mixer for mixing a phase of the output signal from the first delay line and a phase of an output signal from the second delay line and outputting an internal clock having a corrected duty cycle as a result of the mixing.

5 Claims, 6 Drawing Sheets

DELAYED LOCKED LOOP

BACKGROUND

The present disclosure relates to a semiconductor memory device, and more particularly to a delay locked loop.

In general, a delay locked loop (DLL) is used in a synchronous dynamic random access memory (DRAM) to improve the operating speed of the synchronous DRAM. The DLL acts to delay an external clock by a predetermined period such that data can be outputted accurately synchronously with the external clock.

This DLL generates an internal clock by compensating the external clock for internal delay factors of the DRAM.

FIG. 1 is a block diagram showing the configuration of a conventional DLL, and FIGS. 2A and 2B are operation timing diagrams of the DLL of FIG. 1.

As shown in FIG. 1, the conventional DLL has two delay lines 130 and 170, one delay line (130) receiving a normal-phase external clock ECLK, and the other delay line (170) receiving a reverse-phase external clock ECLKB. Each of the delay lines 130 and 170 delays the received external clock by a predetermined period. Then, a phase mixer 140 mixes the phases of outputs DLOUT1 and DLOUT2 of the delay lines 130 and 170 and outputs an intermediate-phase internal clock DLLCLK as a result of the mixing.

In detail, an input clock REFCLK is provided as a feedback clock FBCLK1 through the delay line 130, the phase mixer 140 and a replica 150.

At a first loop 110, a phase detector 160 compares the phase of the feedback clock FBCLK1 with that of a reference clock REFCLK.

A controller performs a locking operation by adjusting the delay amount of the delay line 130 until the comparison result of the phase detector 160 indicates that the feedback clock FBCLK1 and the reference clock REFCLK are in phase with each other.

In other words, the controller performs the locking operation by increasing the delay amount of the delay line 130 when the comparison result of the phase detector 160 indicates that the phase of the feedback clock FBCLK1 is ahead of that of the reference clock REFCLK, and decreasing the delay amount of the delay line 130 when the comparison result of the phase detector 160 indicates that the phase of the feedback clock FBCLK1 is behind that of the reference clock REFCLK.

An operation at a second loop 120 is also performed in a similar manner to the operation at the first loop 110. Because a clock CLKB is used as an input to the delay line 170 of the second loop 120, different delay amounts are applied to the delay lines 130 and 170 of the first and second loops 110 and 120, respectively.

FIG. 2A shows an initial timing of the operation of the DLL. Initially, the feedback clock FBCLK1 and a feedback clock FBCLK2 have phases opposite to each other. Each of the two loops of the DLL performs a locking operation of aligning the rising edge of the feedback clock with the rising edge of the reference clock by increasing the delay amount.

Before the first loop is locked, the phase mixer 140 outputs an internal clock DLLCLK of the same phase as that of the output DLOUT1 of the first delay line 130. At this time, as shown in FIG. 2A, the phase of the internal clock DLLCLK is ahead of that of the feedback clock FBCLK1 by a replica delay, and the duty cycle thereof remains not corrected.

FIG. 2B shows a timing of the operation of the DLL after each loop is locked. Because each loop is in a locked state, the rising edges of the feedback clock FBCLK1 and feedback clock FBCLK2 are aligned with the rising edge of the reference clock REFCLK.

When the two loops are locked, the phase mixer 140 outputs an internal clock DLLCLK having an intermediate phase between the phases of the outputs DLOUT1 and DLOUT2 of the two delay lines 130 and 170. Provided that there is a duty cycle error in the reference clock REFCLK, the rising edges of the outputs DLOUT1 and DLOUT2 after the two loops are locked will be in phase with each other, but the falling edges thereof will be out of phase with each other by the duty cycle error. Here, the internal clock DLLCLK with the intermediate phase between the phases of the outputs DLOUT1 and DLOUT2 has a corrected duty cycle. As a result, this internal clock DLLCLK has a high width and a low width which are equal, namely, 50:50.

However, the above-mentioned conventional DLL has a disadvantage in that delay lines are used in two loops, respectively, resulting in an increase in design area.

BRIEF SUMMARY

In an aspect of the present invention, a delay locked loop comprises a clock selector for selecting and outputting any one of normal-phase and reverse-phase external clocks in response to a clock selection information signal, a first delay line for delaying an output signal from the clock selector by a predetermined amount of time, a second delay line for delaying an output signal from the first delay line by a predetermined amount of time, and a phase mixer for mixing a phase of the output signal from the first delay line and a phase of an output signal from the second delay line and outputting an internal clock having a corrected duty cycle as a result of the mixing.

The clock selection information signal may be generated to select the normal-phase external clock or reverse-phase external clock according to which one of a phase of a feedback clock and a phase of a reference clock is earlier, the feedback clock being generated by delaying the internal clock by a predetermined amount of time.

The delay locked loop may further comprise a replica for delaying the internal clock by a predetermined amount of time and outputting the delayed internal clock, as a feedback clock; and a phase detector for comparing a phase of the feedback clock with that of a reference clock and outputting the clock selection information signal as a result of the comparison.

The delay locked loop may further comprise an inverter for inverting the output signal from the first delay line and outputting the inverted signal as an input signal to the second delay line.

In another aspect of the present invention, a delay locked loop comprises a clock selector for selecting and outputting any one of normal-phase and reverse-phase external clocks in response to a clock selection information signal a first delay line for delaying an output signal from the clock selector by a predetermined amount of time a second delay line for delaying an inverted version of an output signal from the first delay line by a predetermined amount of time, a phase mixer for mixing a phase of the output signal from the first delay line and a phase of an output signal from the second delay line and outputting an internal clock having a corrected duty cycle as a result of the mixing, a replica for delaying the internal clock by a predetermined amount of time and outputting the delayed internal clock as a feedback clock, and a phase detector for comparing a phase of the feedback clock with that of a reference clock and outputting the clock selection information signal as a result of the comparison.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Preferred embodiments of the present invention will now be described in detail with reference to the accompanying drawings.

A delay locked loop (DLL) according to the present invention can reduce the delay amount of a delay line and, in turn, the design area of the DLL under the condition that it has the same performance and characteristics as those of a conventional DLL.

Figure 1:
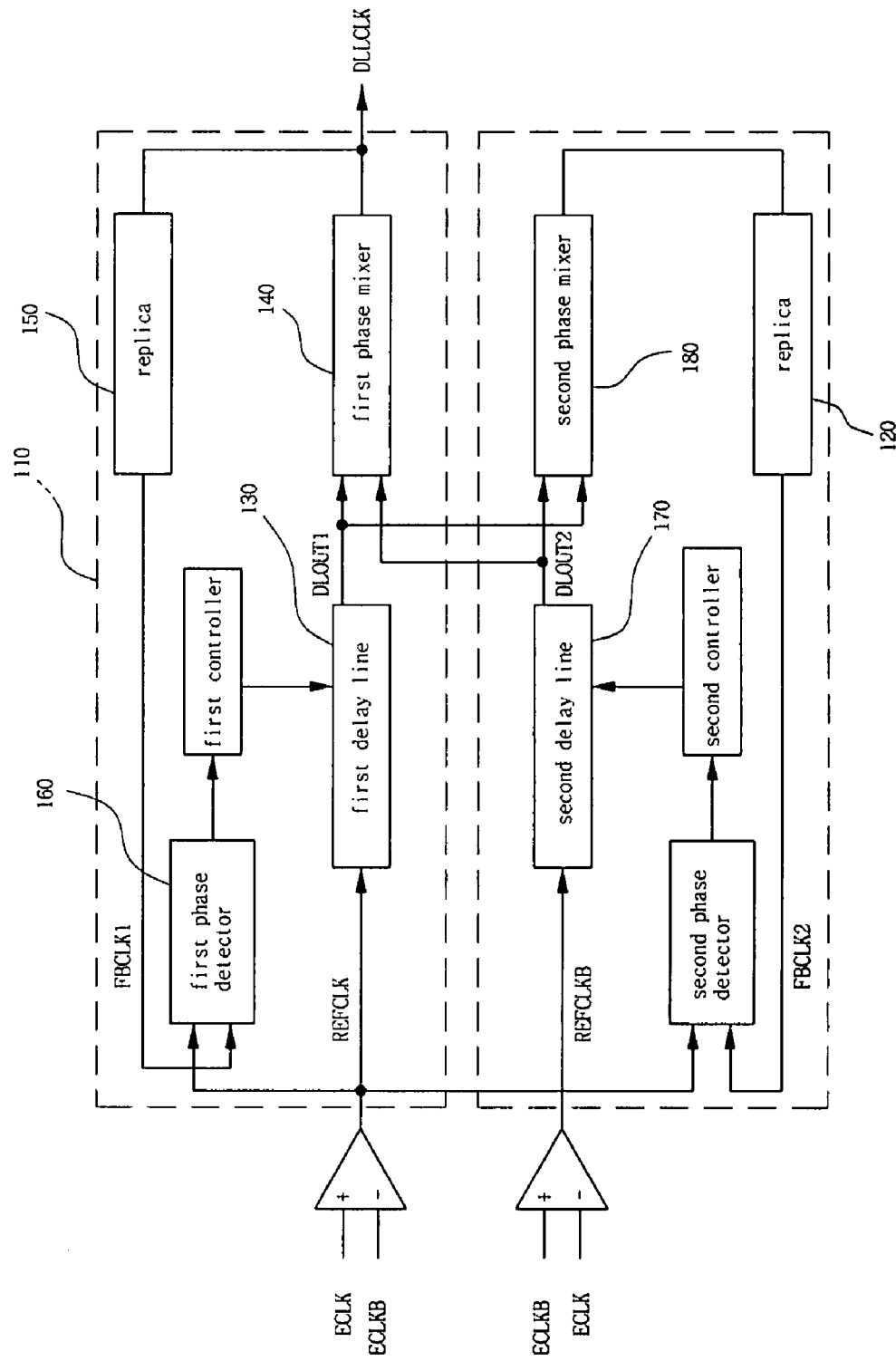
FIG. 1 is a block diagram showing the configuration of a conventional DLL.
Figure 2A:
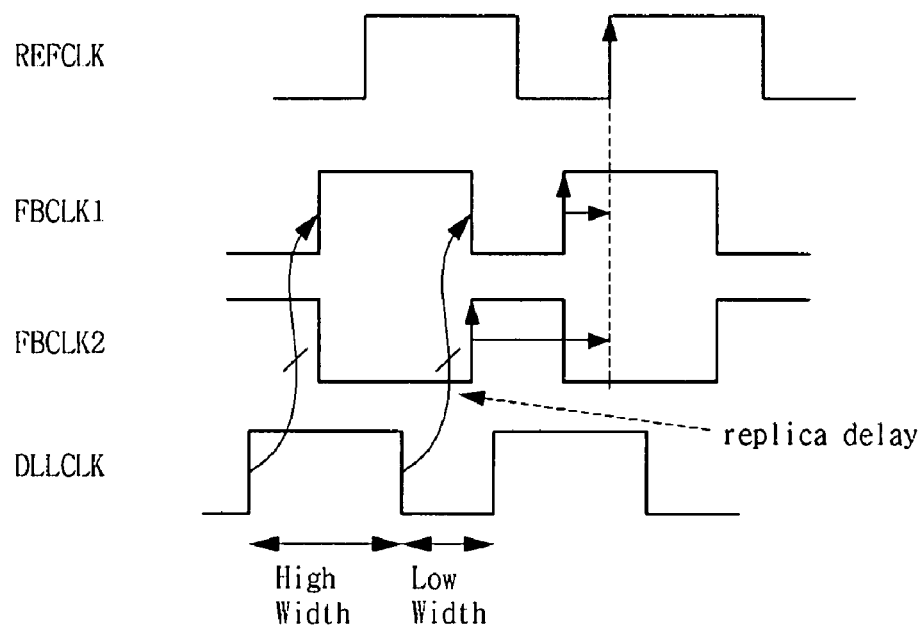
FIGS. 2A and 2B are operation timing diagrams of the DLL of FIG. 1.
Figure 2B:
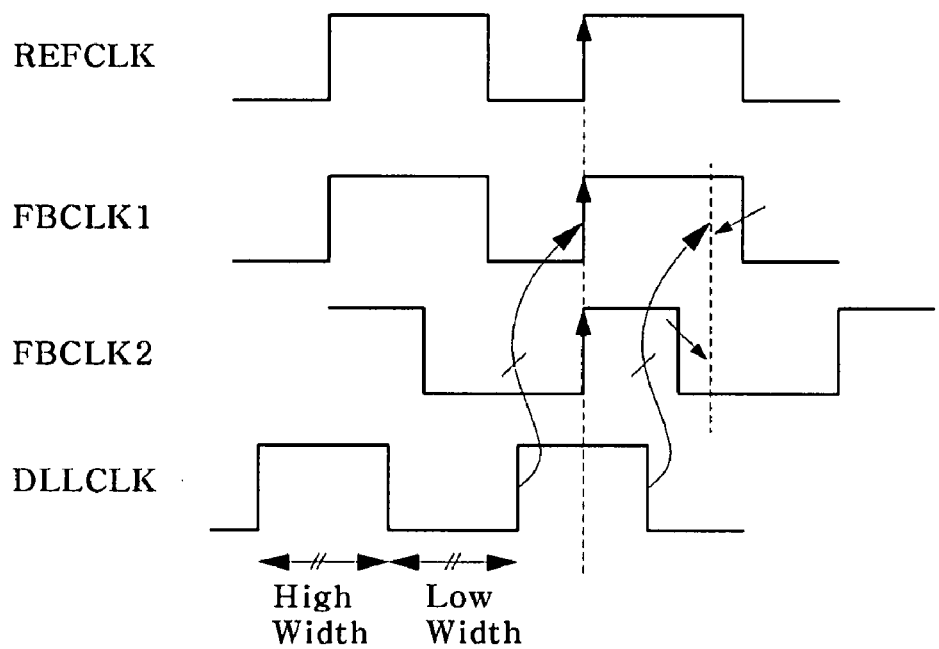
Figure 3:
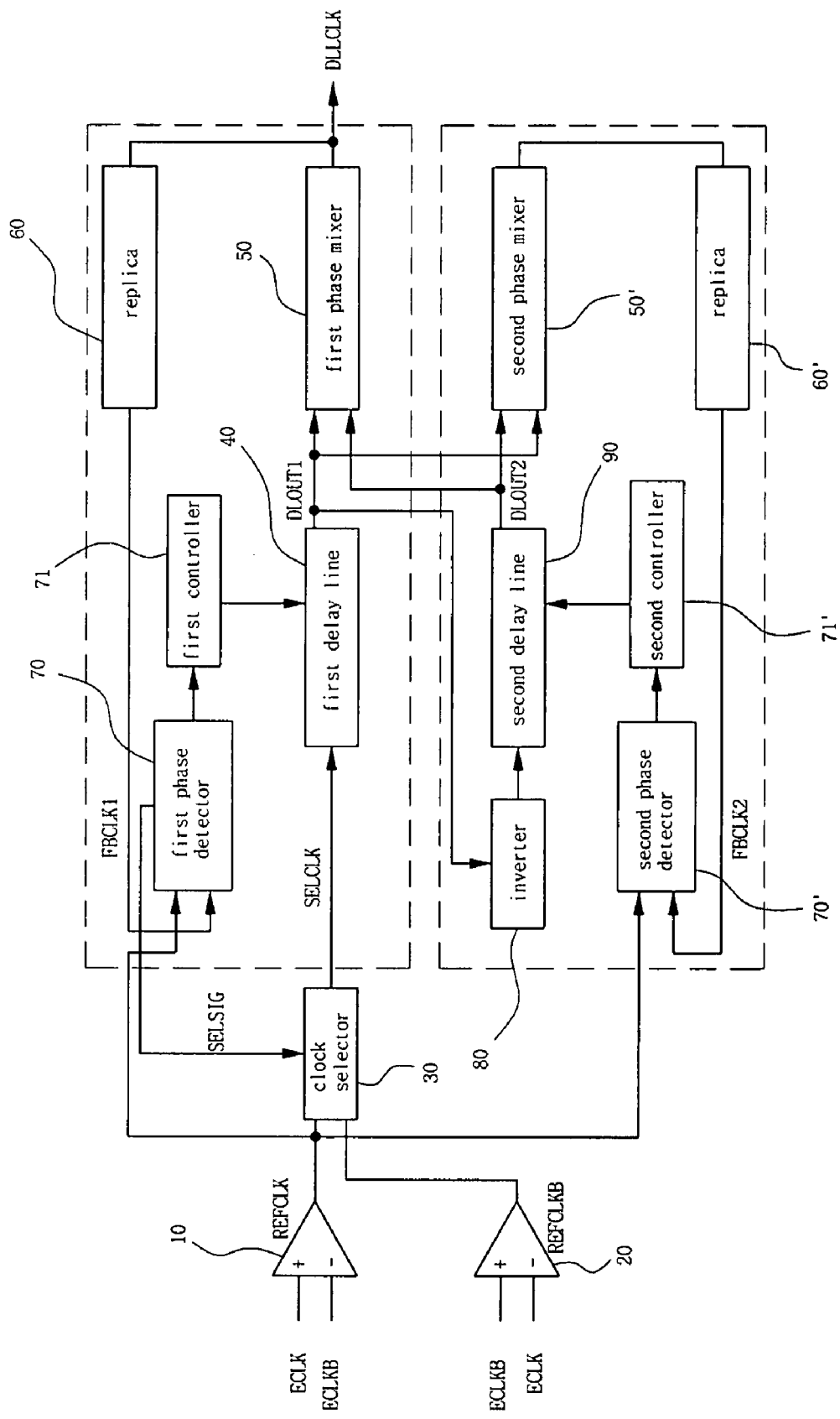
FIG. 3 is a block diagram showing the configuration of a DLL according to an exemplary embodiment of the present invention.

FIG. 3 is a block diagram showing the configuration of a DLL according to an exemplary embodiment of the present invention.

As shown in FIG. 3, the DLL according to this embodiment comprises a clock selector 30 for selecting and outputting any one of normal-phase and reverse-phase external clocks REFCLK and REFCLKB outputted from clock buffers 10 and 20 in response to a clock selection information signal SELSIG, a first delay line 40 for delaying an output signal SELCLK from the clock selector 30 by a predetermined amount of time, a second delay line 90 for delaying an inverted version of an output signal DLOUT1 from the first delay line 40 by a predetermined amount of time, a first phase mixer 50 for mixing the phase of the output signal DLOUT1 from the first delay line 40 and the phase of an output signal DLOUT2 from the second delay line 90 and outputting an internal clock DLLCLK having a corrected duty cycle as a result of the mixing, a replica 60 for delaying the internal clock DLLCLK by a predetermined amount of time and outputting the delayed internal clock as a feedback clock FBCLK1, and a first phase detector 70 for comparing the phase of the feedback clock FBCLK1 with that of a reference clock REFCLK and outputting the clock selection information signal SELSIG as a result of the comparison.

The DLL according to the present embodiment further comprises an inverter 80 for inverting the output signal DLOUT1 from the first delay line 40 and outputting the inverted signal to the second delay line 90.

The DLL according to the present embodiment further comprises a first controller 71 for controlling the delay amount of the first delay line 40 in response to a control signal from the first phase detector 70, and a second controller 71' for controlling the delay amount of the second delay line 90 in response to a control signal from a second phase detector 70'.

The first phase detector 70 outputs, to the clock selector 30, the clock selection information signal SELSIG to select the normal-phase external clock REFCLK when the phase of the feedback clock FBCLK1 is ahead of that of the reference clock REFCLK, and select the reverse-phase external clock REFCLKB when the phase of the feedback clock FBCLK1 is behind that of the reference clock REFCLK.

Figure 4:
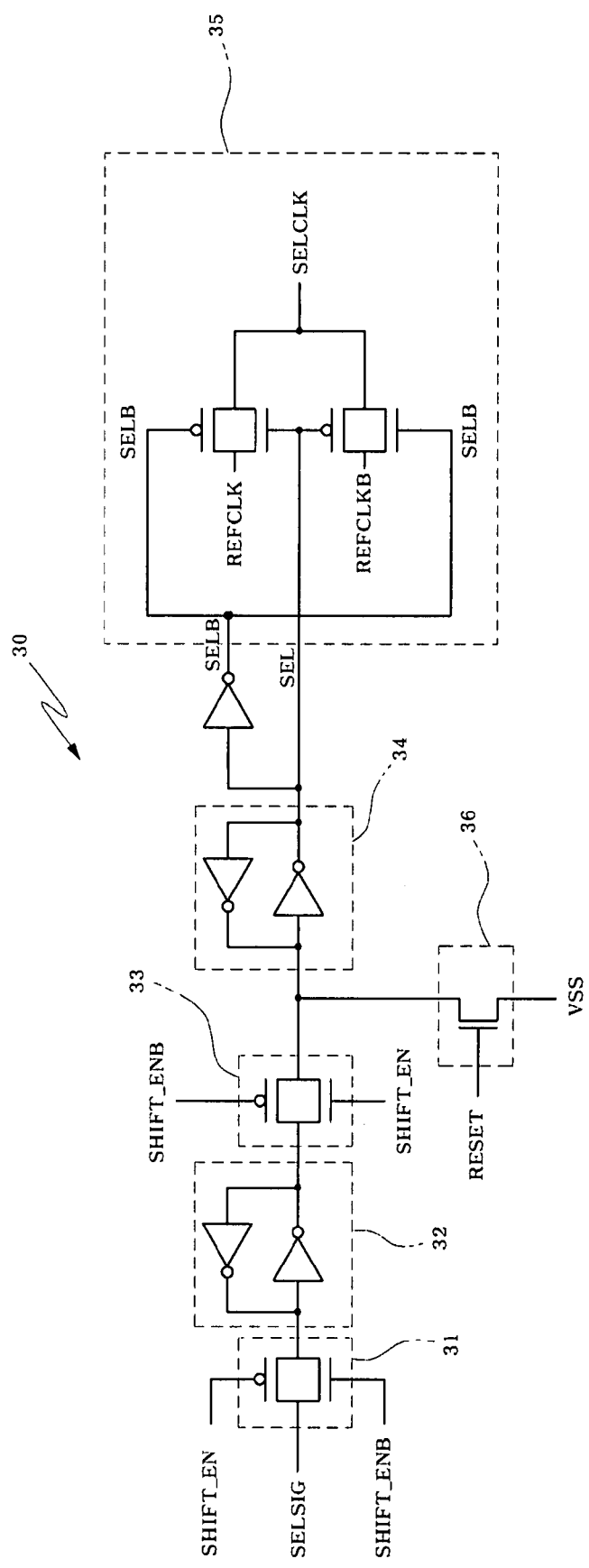
FIG. 4 is a circuit diagram of a clock selector in FIG. 3.

FIG. 4 is a circuit diagram of the clock selector 30 in FIG. 3.

As shown in FIG. 4, the clock selector 30 includes a first transfer gate 31 for transferring the clock selection information signal SELSIG from the first phase detector 70 in response to enable signals SHIFT_EN and SHIFT_ENB of the DLL, a first latch 32 for latching an output signal from the first transfer gate 31, a second transfer gate 33 for transferring an output signal from the first latch 32 in response to the enable signals SHIFT_EN and SHIFT_ENB of the DLL, a second latch 34 for latching an output signal from the second transfer gate 33, and a third transfer gate 35 for transferring the normal-phase external clock REFCLK or reverse-phase external clock REFCLKB in response to an output signal SEL from the second latch 34.

The clock selector 30 further includes an n-channel metal oxide semiconductor (NMOS) driver 36 connected between the second transfer gate 33 and the second latch 34 for outputting a signal having a predetermined logic level to the second latch 34 in response to a reset signal RESET. The NMOS driver 36 acts to keep the output signal SEL from the second latch 34 "high" until, before the DLL performs a shift operation, the normal-phase external clock REFCLK is outputted as the output signal SELCLK of the clock selector 30, provided as the feedback clock FBCLK1 through the first delay line 40, first phase mixer 50 and replica 60 and then phase-compared with the reference clock REFCLK for determination of the clock selection information signal SELSIG.

The first transfer gate 31 transfers the clock selection information signal SELSIG to the first latch 21 when the enable signals SHIFT_EN and SHIFT_ENB of the DLL are deactivated, and the second transfer gate 33 transfers the output signal from the first latch 32 to the second latch 34 when the enable signals SHIFT_EN and SHIFT_ENB of the DLL are activated.

The operation of the DLL with the above-stated configuration according to the present embodiment will hereinafter be described in detail with reference to FIGS. 3 to 6.

The present invention provides the following two approaches to reducing the design area of the DLL.

In the first approach, in the DLL of the structure where each of the two loops perform a locking operation, and the phase mixer 50 receives the outputs of the two delay lines 40 and 90 as inputs thereof and outputs an internal clock DLLCLK with an intermediate phase between the phases of the outputs of the two delay lines 40 and 90, as shown in FIG. 3, the delay lines 40 and 90 have different delay amounts used for the locking operation.

Figure 5A:
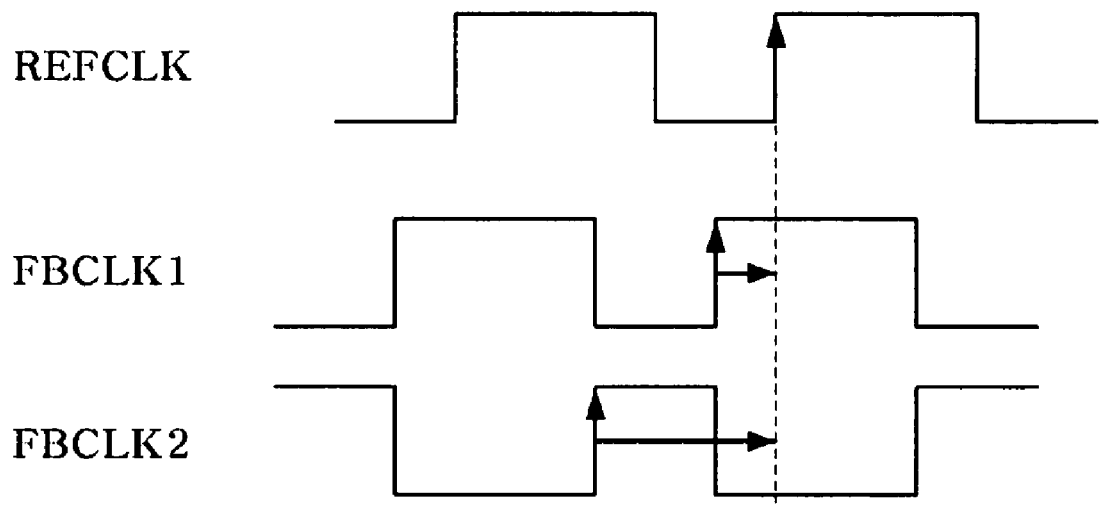
FIGS. 5A and 5B are operation timing diagrams of phase detectors in FIG. 3.
Figure 5B:
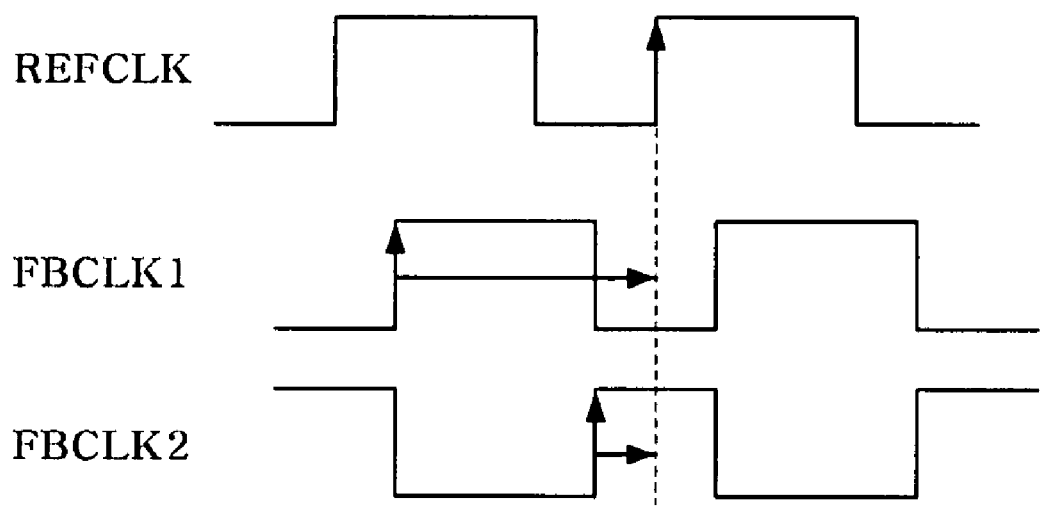

FIGS. 5A and 5B are operation timing diagrams of the phase detectors 70 and 70' in FIG. 3, in which right-directed solid arrows indicate delay amounts to be increased for locking. As shown in FIGS. 5A and 5B, once one loop is locked using a large amount of delay, the other loop can be locked using a small amount of delay.

Which loop uses the small amount of delay can be determined depending on a result of the phase comparison between the feedback clock FBCLK1 and the reference clock REFCLK by the first phase detector 70 when the DLL begins to operate.

That is, if the phase of the feedback clock FBCLK1 is ahead of that of the reference clock REFCLK at the time that the DLL begins to operate, the first loop can be locked using the small amount of delay. Conversely, if the phase of the feedback clock FBCLK1 is behind that of the reference clock REFCLK at the time that the DLL begins to operate, the second loop can be locked using the small amount of delay. Half of the existing delay amount is adequate for the delay line of which loop locked using the small amount of delay.

In the second approach, when which loop using the small amount of delay is locked, the reverse phase of the output of the delay line in this loop can be provided as an input to the delay line in the other loop. Therefore, half of the existing delay amount is also adequate for the delay line of the other loop requiring the large amount of delay.

In more detail, as shown in FIG. 3, the two buffers 10 and 20 are used to generate normal-phase and reverse-phase external clocks REFCLK and REFCLKB based on external clocks ECLK and ECLKB.

Which one of the normal-phase and reverse-phase external clocks REFCLK and REFCLKB can be locked using the small amount of delay can be determined depending on a result of the phase comparison between the feedback clock FBCLK1 and the reference clock REFCLK by the first phase detector 70 at the time that the DLL begins to operate, as stated previously with reference to FIGS. 5A and 5B. The determination result is provided as a clock selection information signal SELSIG.

That is, the phase detector 70, before a shift operation of the first delay line 40 of the DLL is started, compares the phase of the feedback clock FBCLK1, which is generated by passing the normal-phase external clock REFCLK through the clock selector 30, first delay line 40, first phase mixer 50 and replica 60, with the phase of the reference clock REFCLK and outputs the clock selection information signal SELSIG as a result of the comparison. At this time, the clock selection information signal SELSIG has a 'high' value when the phase of the feedback clock FBCLK1 is ahead of that of the reference clock REFCLK, and a 'low' value when the phase of the feedback clock FBCLK1 is behind that of the reference clock REFCLK.

Then, as shown in FIG. 4, the clock selector 30 outputs the normal-phase external clock REFCLK when the clock selection information signal SELSIG is 'high', and the reverse-phase external clock REFCLKB when the clock selection information signal SELSIG is 'low'.

In other words, the first transfer gate 31 in FIG. 4 transfers the clock selection information signal SELSIG to the first latch 32 before the DLL starts the locking operation. At the time that the DLL starts the locking operation, the first transfer gate 31 is disabled and the second transfer gate 33 is enabled, so that a value stored in the first latch 32 is transferred to the second latch 34 and then held therein.

Consequently, the output signal SEL of the second latch 34 has the same value as that of the clock selection information signal SELSIG prior to the DLL locking operation. That is, which one of the normal-phase external clock REFCLK and the reverse-phase external clock REFCLKB will be outputted is determined depending on the clock selection information signal SELSIG.

The clock signal determined in this manner, namely, the output signal SELCLK from the clock selector 30 is inputted to the first delay line 40, and the output signal from the first delay line 40 is inputted to the second delay line 90 through the inverter 80.

If both the first and second delay lines 40 and 90 are locked, then the phase mixer 50 phase-mixes the output signals DLOUT1 and DLOUT2 from the first and second delay lines 40 and 90 and outputs an internal clock DLLCLK having a corrected duty cycle as a result of the mixing.

That is, the operation of the DLL according to the present embodiment can comprise the following steps. The clock selector 30 selects and outputs the normal-phase external clock REFCLK or reverse-phase external clock REFCLKB in response to the clock selection information signal SELSIG before the locking operation of the DLL is started. The first delay line 40 is locked by increasing the delay amount thereof with respect to the output signal SELCLK from the clock selector 30. The second delay line 90 is locked by increasing the delay amount thereof after the first delay line 40 is locked. If both the first and second delay lines 40 and 90 are locked, the phase mixer 50 phase-mixes the output signals DLOUT1 and DLOUT2 from the first and second delay lines 40 and 90 and outputs an internal clock DLLCLK having a corrected duty cycle as a result of the mixing.

Figure 6:
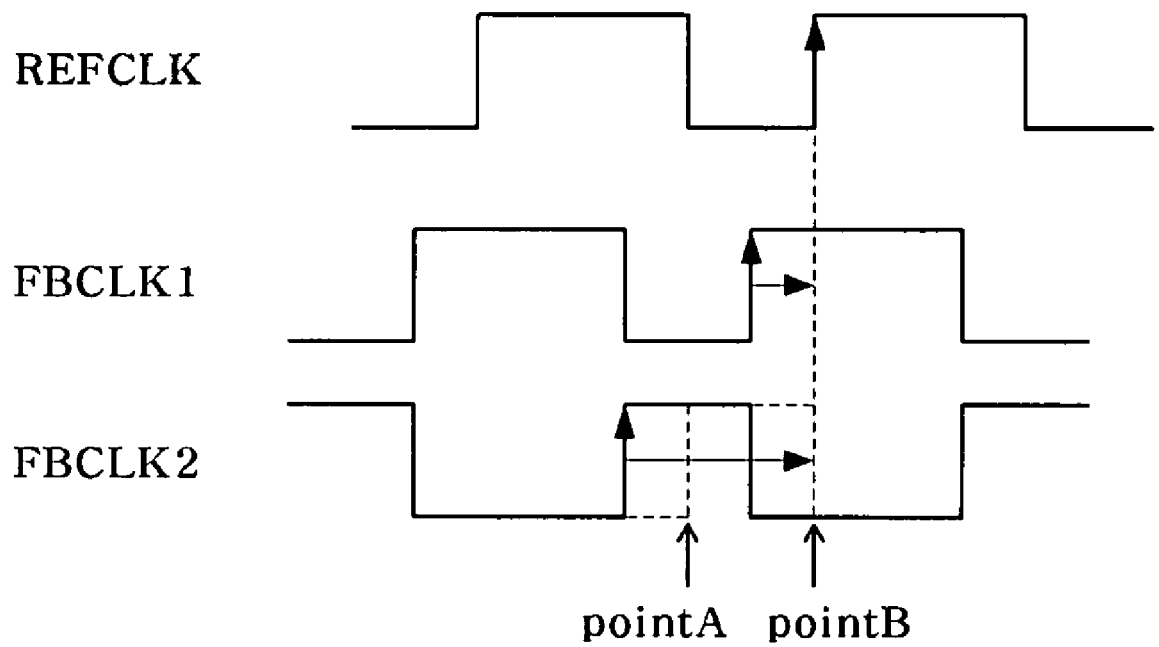
FIG. 6 is a schematic operation timing diagram of the DLL of FIG. 3.

FIG. 6 is a schematic operation timing diagram of the DLL of FIG. 3. If the first delay line 40 is locked, the rising edge of the feedback clock FBCLK1 is aligned with the rising edge of the reference clock REFCLK, and the rising edge of the feedback clock FBCLK2 passed through the second delay line 90 is located at a point A of FIG. 6.

Thereafter, if the second delay line 90 is locked under the condition that the first delay line 40 is kept locked, the rising edge of the feedback clock FBCLK2 is located at a point B of FIG. 6.

In other words, the conventional DLL requires a delay amount of at least an external clock period tCK when locking a delay line by increasing the delay amount thereof. In contrast, the DLL according to the present invention can have the same performance and characteristics as those of the conventional DLL by merely using a delay amount of about ½ of the external clock period tCK.

Therefore, the present invention has the effect of reducing the design area of the DLL by decreasing the delay amount of the delay line.

Although the preferred embodiments of the present invention have been disclosed for illustrative purposes, those skilled in the art will appreciate that various modifications, additions and substitutions are possible, without departing from the scope and spirit of this disclosure and the accompanying claims.

The present application claims priority to Korean patent application number 10-2006-138772, filed on Dec. 29, 2006, the entire contents of which are incorporated herein by reference.

What is claimed is:

1. A delay locked loop comprising:
 a first transfer gate for transferring a clock selection information signal in response to enable signals of the delayed locked loop;
 a first latch for latching an output signal from the first transfer gate;
 a second transfer gate for transferring an output signal from the first latch in response to the enable signals of the delayed locked loop;
 a second latch for latching an output signal from the second transfer gate; and a third transfer gate for transferring a normal-phase external clock or reverse-phase external clock in response to an output signal from the second latch.

2. The delay locked loop according to claim 1, further comprising:

a first delay line for delaying an output signal from the third transfer gate by a predetermined time;

a second delay line for delaying an output signal from the first delay line by a predetermined time; and a phase mixer for mixing a phase of the output signal from the first delay line and a phase of an output signal from the second delay line and outputting an internal clock having a corrected duty cycle as a result of the mixing.

3. The delay locked loop according to claim 2, wherein the first transfer gate transfers the clock selection information signal to the first latch when the enable signals of the delay locked loop are deactivated.

4. The delayed locked loop according to claim 2, wherein the second transfer gate transfers the output signal from the first latch to the second latch when the enable signals of the delay locked loop are activated.

5. The delay locked loop according to claim 2, further comprising a clock selector including an n-channel metal oxide semiconductor (NMOS) driver connected between the second transfer gate and the second latch for outputting a signal having a predetermined logic level to the second latch in response to a reset signal.

* * * * *